United States Patent
Kimura et al.

(10) Patent No.: US 9,647,421 B2
(45) Date of Patent: May 9, 2017

(54) SEMICONDUCTOR LASER MODULE AND METHOD OF MANUFACTURING THE SAME

(71) Applicant: FUJIKURA LTD., Tokyo (JP)

(72) Inventors: Naoki Kimura, Sakura (JP); Susumu Nakaya, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 14/843,408

(22) Filed: Sep. 2, 2015

(65) Prior Publication Data

US 2015/0380896 A1 Dec. 31, 2015

Related U.S. Application Data

(63) Continuation of application No. PCT/JP2014/055239, filed on Mar. 3, 2014.

(30) Foreign Application Priority Data

Mar. 5, 2013 (JP) .................. 2013-043015

(51) Int. Cl.
*H01S 5/022* (2006.01)
*G02B 27/09* (2006.01)
*H01S 5/00* (2006.01)

(52) U.S. Cl.
CPC ...... *H01S 5/02288* (2013.01); *G02B 27/0955* (2013.01); *H01S 5/02252* (2013.01); *H01S 5/005* (2013.01)

(58) Field of Classification Search
CPC .................................................. H01S 5/02252

(Continued)

(56) References Cited

U.S. PATENT DOCUMENTS 5,579,422 A 11/1996 Head et al.
5,633,761 A 5/1997 Takashima et al.
(Continued)

FOREIGN PATENT DOCUMENTS

JP 4-131810 A 5/1992
JP 6-077608 A 3/1994
(Continued)

OTHER PUBLICATIONS

International Search Report dated Apr. 28, 2014, issued in counterpart Application No. PCT/JP2014/055239 (2 pages).
(Continued)

*Primary Examiner* — James Jones
(74) *Attorney, Agent, or Firm* — Westerman, Hattori, Daniels & Adrian, LLP

(57) ABSTRACT

The semiconductor laser module 1 has a first substrate 10, a second substrate 20 provided on the first substrate 10, a semiconductor laser device 30 operable to emit a laser beam L having an optical axis along the Z-direction, a collimator lens 40 configured to collimate components of the laser beam L along a direction of a fast axis (Y-direction), and a lens fixture block 50 having a lens attachment surface 50A and a block fixation surface 50B that are perpendicular to the X-direction. An end 40A of the collimator lens 40 along the X-direction is fixed to the lens attachment surface 50A of the lens fixture block 50 with a lens fixation resin 42. The block fixation surface 50B of the lens fixture block 50 is fixed to a side surface 20A of the second substrate 20 along the X-direction with a block fixation resin 52.

12 Claims, 9 Drawing Sheets

(58) Field of Classification Search
USPC .......................................................... 359/641
See application file for complete search history.

(56) References Cited

U.S. PATENT DOCUMENTS

| | | | |
|---|---|---|---|
| 5,793,792 A | 8/1998 | Baxter et al. | |
| 2004/0218636 A1 | 11/2004 | Kashima et al. | |
| 2004/0258124 A1 | 12/2004 | Lissotschenko | |
| 2005/0147149 A1 | 7/2005 | Fuse | |
| 2006/0222042 A1* | 10/2006 | Teramura | G02B 7/025 372/101 |
| 2012/0294326 A1 | 11/2012 | Seibert | |

FOREIGN PATENT DOCUMENTS

| | | |
|---|---|---|
| JP | 11-109188 A | 4/1999 |
| JP | 2002-232057 A | 8/2002 |
| JP | 2002-314188 A | 10/2002 |
| JP | 3423723 B | 7/2003 |
| JP | 2003-347649 A | 12/2003 |
| JP | 2004-200634 A | 7/2004 |
| JP | 2004-207551 A | 7/2004 |
| JP | 2005-037642 A | 2/2005 |
| JP | 2005-166735 A | 6/2005 |
| JP | 2005-189378 A | 7/2005 |
| JP | 2005-223117 A | 8/2005 |
| JP | 2006-284851 A | 10/2006 |
| JP | 2007-219337 A | 8/2007 |
| JP | 2010-232370 A | 10/2010 |

OTHER PUBLICATIONS

Office Action dated Apr. 30, 2014, issued in counterpart Japanese Application No. 2013-043015, with English translation (12 pages).
Office Action dated Oct. 5, 2016, issued in related EP Patent Application No. 14759748.8.

* cited by examiner

SEMICONDUCTOR LASER MODULE AND METHOD OF MANUFACTURING THE SAME

TECHNICAL FIELD

The present invention relates to a semiconductor laser module and a method of manufacturing the same. More particularly, the present invention relates to a semiconductor laser module including a semiconductor laser device and a collimator lens for collimating a laser beam emitted from the semiconductor laser device and to a method of manufacturing such a semiconductor laser module.

BACKGROUND ART

Generally, a direction perpendicular to a p-n junction of a semiconductor laser device is referred to as a fast axis, whereas a direction in parallel to the p-n junction is referred to as a slow axis. A numerical aperture of a semiconductor laser device in a direction along its fast axis is much greater than that in a direction along its slow axis. Therefore, a laser beam emitted from a semiconductor laser device greatly spreads in a direction along its fast axis. Accordingly, a collimator lens for collimating fast-axis components of a laser beam emitted from a semiconductor laser device should be arranged near an emitting surface of the semiconductor laser device (see, e.g., Patent Literature 1 and Patent Literature 2).

In order to arrange a desired optical system using such a collimator lens, it is necessary to fix the collimator lens highly precisely relative to a semiconductor laser device in a direction parallel to an optical axis and a direction parallel to a fast axis and to prevent variations in positional relationship between the semiconductor laser device and the collimator lens. Specifically, the positional relationship between the semiconductor laser device and the collimator lens should be fixed and maintained in the micron order.

For example, in an optical fiber attachment apparatus disclosed in FIG. 4 of Patent Literature 1, a collimator lens (optical fiber lens 26) is attached so that it can slide along its axis. In order to attach the optical fiber lens 26 in a slidable manner, a certain clearance needs to be formed between a cylindrical clamp 52 and the optical fiber lens 26. Therefore, variation in position of the optical fiber lens 26 cannot be reduced in the micron order in both of a direction of an optical axis of a laser beam emitted from a semiconductor laser device bar 10 and a direction along a fast axis.

Furthermore, the optical fiber lens 26 of Patent Literature 1 is fixed to an attachment member 40 with an epoxy resin 50. The optical fiber lens 26 is deviated in the direction of the optical axis of the laser beam by shrinkage of the epoxy resin 50 on curing. Moreover, since the optical fiber lens 26 is fixed directly to the attachment member 40 with the epoxy resin 50, the amount of the epoxy resin 50 that is not less than required for alignment needs to be provided between the attachment member 40 and the optical fiber lens 26 in order to conduct alignment of the optical fiber lens 26. The optical fiber lens 26 is also deviated in a direction along its fast axis by shrinkage or expansion of the epoxy resin 50 due to a temperature change or a humidity change.

Furthermore, Patent Literature 2 discloses a semiconductor laser module in which a semiconductor laser device 1 and a collimator lens 6 are fixed to one supplementary member 4 with brazing layers 5 and 8, respectively, to reduce variations in positional relationship between the semiconductor laser device 1 and the collimator lens 6 in cooperation with deflection of the semiconductor laser device 1 and deflection of the collimator lens 6. When the position of the semiconductor laser device 1 is adjusted, the semiconductor laser device 1 needs to be positioned at a high temperature of, for example, about 400° C. in order to braze the brazing layers 5 and 8. However, a laser beam cannot be emitted from the semiconductor laser device 1 at such a high temperature. Thus, there is a problem that the collimator lens 6 cannot be aligned while a laser beam is emitted from the semiconductor laser device 1 (what is called active alignment cannot be performed).

In this case, active alignment can be performed if the semiconductor laser device 1 and the collimator lens 6 are fixed with a resin or the like instead of the brazing layers 5 and 8. In such a case, however, the position of the supplementary member 4 and the collimator lens 6 greatly varies relative to the semiconductor laser device 1 due to shrinkage or expansion of the resin. Accordingly, there is a problem that the collimator lens 6 is deviated from the aligned position.

PRIOR ART LITERATURE

Patent Literature

Patent Literature 1: JP 2004-200634 A
Patent Literature 2: JP 3423723 B

SUMMARY OF INVENTION

Problem(s) to be Solved by the Invention

The present invention has been made in view of the above drawbacks in the prior art. It is, therefore, a first object of the present invention to provide a semiconductor laser module capable of reducing influence from shrinkage or expansion of a resin for fixing a collimator lens and of holding the collimator lens in a highly precisely aligned state.

Furthermore, a second object of the present invention is to provide a method of manufacturing a semiconductor laser module that can fix a collimator lens with high precision relative to a semiconductor laser device while active alignment of the collimator lens is performed.

Means for Solving Problem(s)

According to a first aspect of the present invention, there is provided a semiconductor laser module capable of reducing influence from shrinkage or expansion of a resin for fixing a collimator lens and of holding the collimator lens in a highly precisely aligned state. The semiconductor laser module has a substrate, a device-mounting portion provided on the substrate, and a semiconductor laser device mounted on the device-mounting portion. The semiconductor laser device emits a laser beam having an optical axis along a first direction. The semiconductor laser module has a collimator lens configured to collimate a component of the laser beam emitted from the semiconductor laser device along a second direction perpendicular to the first direction and a lens fixture block having a lens attachment surface perpendicular to a third direction that is perpendicular to the first direction and the second direction and a block fixation surface perpendicular to the third direction. At least one of ends of the collimator lens along the third direction is fixed to the lens attachment surface of the lens fixture block with a lens fixation resin. The block fixation surface of the lens fixture block is fixed to a side surface of the device-mounting portion along the third direction with a block fixation resin.

Thus, according to the first aspect of the present invention, the lens fixation resin for fixing the collimator lens is provided between the end of the collimator lens along the third direction and the lens attachment surface perpendicular to the third direction. Therefore, shrinkage of the lens fixation resin on curing or shrinkage or expansion of the lens fixation resin due to a temperature change or a humidity change primarily causes the position of the collimator lens to vary only in the third direction. Furthermore, the position of the collimator lens does not need to be adjusted in the third direction. Thus, in terms of optics, the collimator lens may be located at any position in the third direction. Therefore, the thickness of the lens fixation resin between the collimator lens and the lens attachment surface can be reduced so as to reduce the amount of variation of the lens fixation resin per se due to shrinkage or expansion of the lens fixation resin. Accordingly, the collimator lens hardly changes its position in the first direction or the second direction. As a result, influence from shrinkage or expansion of the lens fixation resin for fixing the collimator lens can be reduced. Thus, the collimator lens can be held in a highly precisely aligned state.

Furthermore, the block fixation resin for fixing the lens fixture block is provided between the block fixation surface of the lens fixture block, which is perpendicular to the third direction, and the side surface of the device-mounting portion along the third direction. Therefore, shrinkage or expansion of the block fixation resin primarily causes the position of the lens fixture block to vary only in the third direction. Furthermore, the position of the collimator lens does not need to be adjusted in the third direction. Thus, in terms of optics, the collimator lens may be located at any position in the third direction. Therefore, the thickness of the block fixation resin between the lens fixture block and the side surface of the device-mounting portion along the third direction can be reduced so as to reduce the amount of variation of the block fixation resin per se due to shrinkage or expansion of the block fixation resin. Accordingly, the lens fixture block hardly changes its position in the Y-direction or the Z-direction. As a result, the collimator lens, which is fixed to the lens fixture block, hardly changes its position in the Y-direction or the Z-direction. Thus, the collimator lens can be held in a highly precisely aligned state.

The second direction may be a direction along a fast axis of the laser beam emitted from the semiconductor laser device. Furthermore, a UV-curable resin or a thermosetting resin may be used as the lens fixation resin. Moreover, a UV-curable resin or a thermosetting resin may be used as the block fixation resin. The device-mounting portion may include a mounting substrate on which the semiconductor laser device is mounted and a spacer having a certain thickness. The block fixation surface of the lens fixture block may be fixed to a side surface of the spacer of the device-mounting portion along the third direction with the block fixation resin.

Preferably, an equal amount of the lens fixation resin is present on opposite sides of the collimator lens along the first direction. With this configuration, the lens fixation resin equally shrinks or expands on the opposite sides of the collimator lens along the first direction so that the shrinkage or expansion is cancelled out on the opposite sides of the collimator lens along the first direction. Accordingly, shrinkage or expansion of the lens fixation resin exerts substantially no influence on the collimator lens along the first direction. Similarly, an equal amount of the lens fixation resin is preferably present on opposite sides of the collimator lens along the second direction. With this configuration, the lens fixation resin equally shrinks or expands on the opposite sides of the collimator lens along the second direction so that the shrinkage or expansion is cancelled out on the opposite sides of the collimator lens along the second direction. Accordingly, shrinkage or expansion of the lens fixation resin exerts substantially no influence on the collimator lens along the second direction.

The position of the lens attachment surface of the lens fixture block may be located farther away from the device-mounting portion than the position of the block fixation surface of the lens fixture block along the third direction. Alternatively, a groove may be formed between the lens attachment surface and the block fixation surface of the lens fixture block for preventing the lens fixation resin from being brought into contact with the device-mounting portion. With those configurations, the lens fixation resin is prevented from being brought into contact with the device-mounting portion when the lens fixture block is brought closer to the device-mounting portion.

According to a second aspect of the present invention, there is provided a method of manufacturing a semiconductor laser module that can fix a collimator lens with high precision relative to a semiconductor laser device while active alignment of the collimator lens is performed. This manufacturing method produces a semiconductor laser module having a semiconductor laser device operable to emit a laser beam having an optical axis along a first direction and a collimator lens configured to collimate a component of the laser beam emitted from the semiconductor laser device along a second direction perpendicular to the first direction. With this manufacturing method, the semiconductor laser device is mounted to a device-mounting portion, and the device-mounting portion is fixed to a substrate. A lens fixation resin is applied to a lens attachment surface formed on a lens fixture block. An end of the collimator lens along the third direction is inserted into the lens fixation resin applied to the lens attachment surface in a state in which the lens attachment surface is perpendicular to a third direction that is perpendicular to the first direction and the second direction. The lens fixation resin is hardened to fix the collimator lens to the lens fixture block. Furthermore, a block fixation resin is applied to a side surface of the device-mounting portion along the third direction. The lens fixture block is brought into contact with the block fixation resin. The collimator lens is positioned into a desired location while a laser beam is emitted from the semiconductor laser device. When the collimator lens has been positioned, the block fixation resin is hardened to fix the lens fixture block and the collimator lens relative to the device-mounting portion.

Thus, according to the second aspect of the present invention, the collimator lens is fixed to the lens fixture block with the lens fixation resin. Therefore, this method does not require to hold an atmosphere at a high temperature, unlike solder jointing disclosed in Patent Literature 2. Accordingly, the collimator lens can be positioned in place while a laser beam is emitted from the semiconductor laser device (active alignment). Additionally, the lens fixation resin is provided between the end of the collimator lens along the third direction and the lens attachment surface parallel to the laser beam (first direction). Therefore, shrinkage of the lens fixation resin on curing or shrinkage or expansion of the lens fixation resin due to a temperature change or a humidity change primarily causes the position of the collimator lens to vary only in the third direction. Furthermore, the position of the collimator lens does not need to be adjusted in the third direction. Thus, in terms of optics, the collimator lens may be located at any position in the third direction. Therefore, the thickness of the lens fixation resin between the collimator lens and the lens attachment surface can be reduced so as to reduce the amount of variation of the lens fixation resin per se due to shrinkage or expansion of the lens fixation resin. Accordingly, the collimator lens hardly changes its position in the first direction or the second direction. As a result, the collimator lens can be fixed to the semiconductor laser device with high precision.

Furthermore, the block fixation resin for fixing the lens fixture block is provided between the block fixation surface of the lens fixture block, which is perpendicular to the third direction, and the side surface of the device-mounting portion along the third direction. Therefore, shrinkage or expansion of the block fixation resin primarily causes the position of the lens fixture block to vary only in the third direction. Furthermore, the position of the collimator lens does not need to be adjusted in the third direction. Thus, in terms of optics, the collimator lens may be located at any position in the third direction. Therefore, the thickness of the block fixation resin between the lens fixture block and the side surface of the device-mounting portion along the third direction can be reduced so as to reduce the amount of variation of the block fixation resin per se due to shrinkage or expansion of the block fixation resin. Accordingly, the lens fixture block hardly changes its position in the Y-direction or the Z-direction. As a result, the collimator lens, which is fixed to the lens fixture block, hardly changes its position in the Y-direction or the Z-direction. Thus, the collimator lens can be held in a highly precisely aligned state.

The second direction may be a direction along a fast axis of the laser beam emitted from the semiconductor laser device. Furthermore, a UV-curable resin or a thermosetting resin may be used as the lens fixation resin. Moreover, a UV-curable resin or a thermosetting resin may be used as the block fixation resin. The device-mounting portion may include a mounting substrate and a spacer having a certain thickness. The semiconductor laser device may be mounted on the mounting substrate, and the mounting substrate may be fixed to the spacer. The block fixation surface of the lens fixture block may be fixed to a side surface of the spacer of the device-mounting portion along the third direction with the block fixation resin. The block fixation resin may be applied to a side surface of the spacer along the third direction.

Furthermore, when the end of the collimator lens is inserted into the lens fixation resin, it is preferable to equalize the amounts of the lens fixation resin present on opposite sides of the collimator lens along the first direction. With this configuration, the lens fixation resin equally shrinks or expands on the opposite sides of the collimator lens along the first direction so that the shrinkage or expansion is cancelled out on the opposite sides of the collimator lens along the first direction. Accordingly, shrinkage or expansion of the lens fixation resin exerts substantially no influence on the collimator lens along the first direction. Similarly, it is preferable to equalize the amounts of the lens fixation resin present on opposite side of the collimator lens along the second direction. With this configuration, the lens fixation resin equally shrinks or expands on the opposite sides of the collimator lens along the second direction so that the shrinkage or expansion is cancelled out on the opposite sides of the collimator lens along the second direction. Accordingly shrinkage or expansion of the lens fixation resin exerts substantially no influence on the collimator lens along the second direction.

Advantageous Effects of the Invention

According to the present invention, there can be provided a semiconductor laser module capable of reducing influence from shrinkage or expansion of a resin for fixing a collimator lens and of holding the collimator lens in a highly precisely aligned state. Furthermore, according to the present invention, there can be provided a method of manufacturing a semiconductor laser module that can fix a collimator lens with high precision relative to a semiconductor laser device while active alignment of the collimator lens is performed.

MODE(S) FOR CARRYING OUT THE INVENTION

Figure 1:
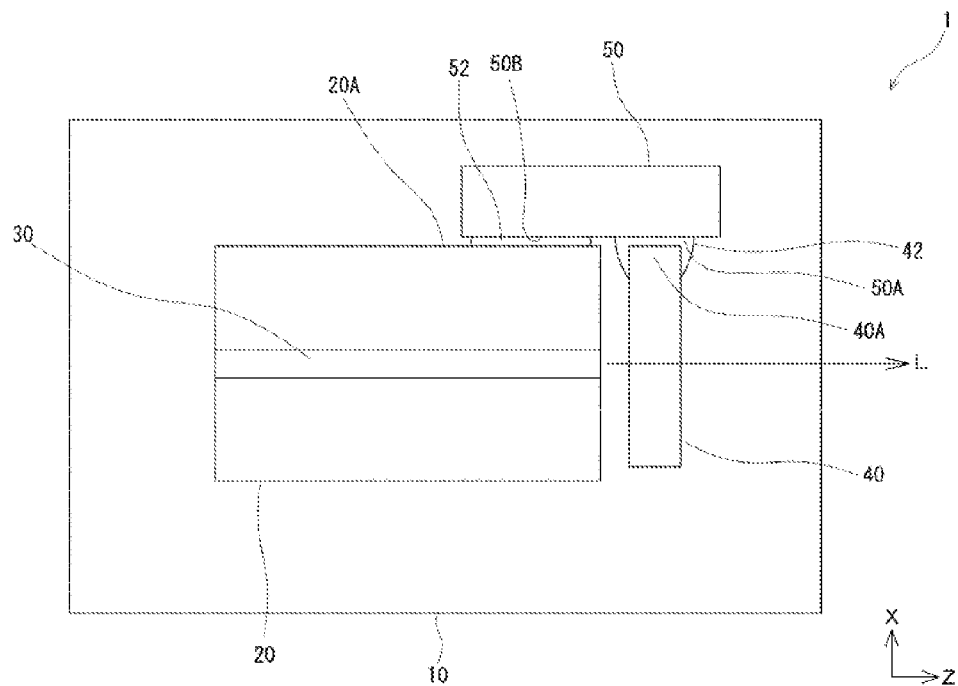
FIG. 1 is a plan view showing a semiconductor laser module according to a first embodiment of the present invention.

Embodiments of a semiconductor laser module according to the present invention will be described in detail below with reference to FIGS. 1 to 8. The same or corresponding components are denoted by the same reference numerals in FIGS. 1 to 8 so as to avoid redundant explanation.

Figure 2:
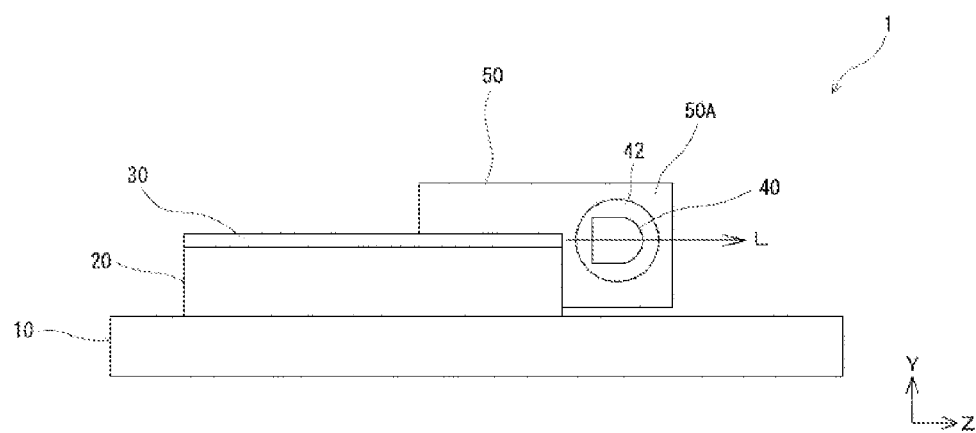
FIG. 2 is a front view of the semiconductor laser module shown in FIG. 1.
Figure 3:
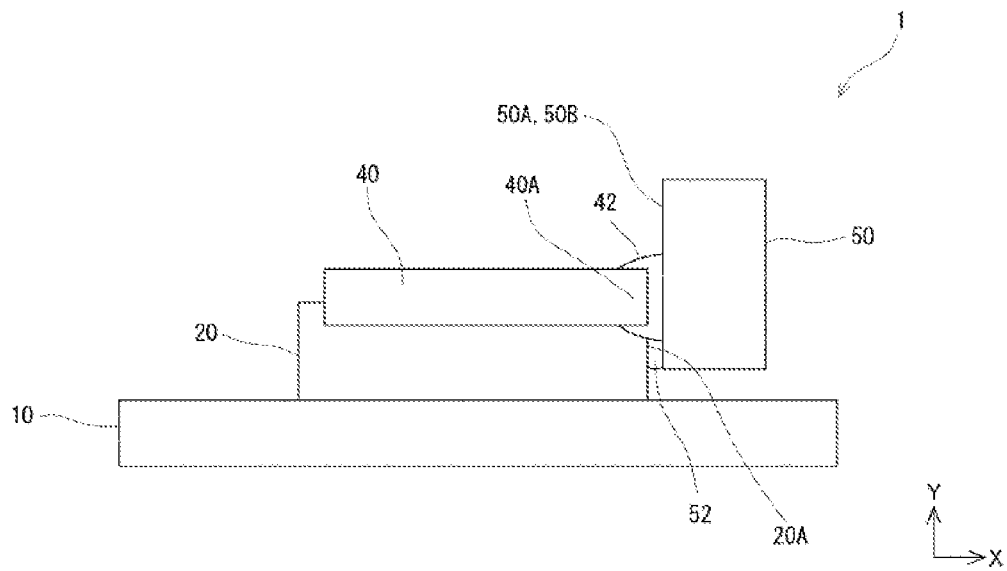
FIG. 3 is a side view of the semiconductor laser module shown in FIG. 1.

FIG. 1 is a plan view showing a semiconductor laser module 1 according to a first embodiment of the present invention, FIG. 2 is a front view thereof, and FIG. 3 is a side view thereof. As shown in FIGS. 1 to 3, the semiconductor laser module 1 of this embodiment has a first substrate 10, a second substrate 20 (device-mounting portion) fixed onto the first substrate 10, a semiconductor laser device (laser diode) 30 mounted on the second substrate 20, and a collimator lens 40 for collimating a laser beam emitted from the semiconductor laser device 30. In FIG. 1, the semiconductor laser device 30 emits a laser beam L along the Z-direction. The following description assumes that the Y-direction illustrated in FIG. 2 is parallel to a fast axis of the laser beam L.

The collimator lens 40 collimates components of the laser beam L emitted from the semiconductor laser device 30 along a direction of the fast axis (Y-direction) to generate parallel rays. In the present embodiment, as shown in a cross-section of the collimator lens 40 on the YZ-plane in FIG. 2, a surface of the collimator lens 40 into which the laser beam L is incident is in parallel to the Y-axis, and a surface of the collimator lens 40 from which the laser beam is outputted is convex. With such a cross-section, the collimator lens 40 extends along a direction of the slow axis of the laser beam L (X-direction). For example, the collimator lens 40 has a length of about 2 mm along the X-direction. The collimator lens 40 is aligned to generate desired parallel rays and positioned highly precisely with respect to the Y-direction and the Z-direction.

As shown in FIGS. 1 to 3, the semiconductor laser module 1 of the present embodiment has a lens fixture block 50 that is substantially in the form of a rectangular parallelepiped made of for example, glass or the like. The lens fixture block 50 has a lens attachment surface 50A and a block fixation surface 50B, which are in parallel to an optical axis of the laser beam L. In the present embodiment, the lens attachment surface 50A and the block fixation surface 50B are coplanar with each other. The lens attachment surface 50A and the block fixation surface 50B are also configured to be in parallel to the fast axis (Y-direction) of the laser beam L, i.e., to be perpendicular to the X-direction.

As shown in FIGS. 1 and 3, the block fixation surface 50B of the lens fixture block 50 is fixed to a side surface 20A of the second substrate 20 in the X-direction with a block fixation resin 52. The lens fixture block 50 is held out of contact with the first substrate 10. In other words, the lens fixture block 50 is cantilevered by the second substrate 20. For example, UV-curable resins or thermosetting resins may be used as the block fixation resin 52. Here, it is preferable to reduce the thickness of the block fixation resin 52 between the block fixation surface 50B of the lens fixture block 50 and the side surface 20A of the second substrate 20.

The collimator lens 40 has an end 40A along the X-direction that is fixed to the lens attachment surface 50A of the lens fixture block 50 with a lens fixation resin 42. The collimator lens 40 is held out of contact with the first substrate 10. In other words, the collimator lens 40 is cantilevered by the lens fixture block 50. For example, UV-curable resins or thermosetting resins may be used as the lens fixation resin 42. The lens fixation resin 42 fixes the end 40A of the collimator lens 40 in the X-direction, the Y-direction, and the Z-direction. Preferably, an equal amount of the lens fixation resin 42 is present on opposite sides of the collimator lens 40 along the Z-direction. Furthermore, an equal amount of the lens fixation resin 42 is preferably present on opposite sides of the collimator lens 40 along the Y-direction. Moreover, it is preferable to reduce the thickness of the lens fixation resin 42 between the collimator lens 40 and the lens attachment surface 50A.

The lens fixation resin 42 for fixing the collimator lens 40 is provided between the end 40A of the collimator lens 40 along the X-direction and the lens attachment surface 50A, which is perpendicular to the X-direction. Therefore, shrinkage of the lens fixation resin 42 on curing or shrinkage or expansion of the lens fixation resin 42 due to a temperature change or a humidity change primarily causes the position of the collimator lens 40 to vary only in the X-direction, i.e., the direction of the slow axis. Furthermore, reduction in thickness of the lens fixation resin 42 between the collimator lens 40 and the lens attachment surface 50A can reduce the amount of variation of the lens fixation resin 42 per se due to shrinkage or expansion of the lens fixation resin 42. Therefore, the collimator lens 40 hardly changes its position in the Y-direction or the Z-direction. Accordingly, the collimator lens 40 can be held in a highly precisely aligned state.

In the example shown in FIGS. 1 to 3, the entire end surface of the end 40A of the collimator lens 40 along the X-direction is fixed to the lens attachment surface 50A with the lens fixation resin 42. Nevertheless, at least part of the end surface of the end 40A of the collimator lens 40 along the X-direction may be fixed to the lens attachment surface 50A with the lens fixation resin 42.

Furthermore, when an equal amount of the lens fixation resin 42 is present on opposite sides of the collimator lens 40 along the Z-direction, the lens fixation resin 42 equally shrinks or expands on the opposite sides of the collimator lens 40 so that the shrinkage or expansion is cancelled out on the opposite sides of the collimator lens 40. Accordingly, shrinkage or expansion of the lens fixation resin 42 exerts substantially no influence on the collimator lens 40 along the Z-direction. Moreover, when an equal amount of the lens fixation resin 42 is present on opposite sides of the collimator lens 40 along the Y-direction, the lens fixation resin 42 equally shrinks or expands on the opposite sides of the collimator lens 40 so that the shrinkage or expansion is cancelled out on the opposite sides of the collimator lens 40. Accordingly, shrinkage or expansion of the lens fixation resin 42 exerts substantially no influence on the collimator lens 40 along the Y-direction.

Furthermore, the block fixation resin 52 for fixing the lens fixture block 50 is provided between the block fixation surface 50B of the lens fixture block 50, which is perpendicular to the X-direction, and the side surface 20A of the second substrate 20 along the X-direction. Therefore, shrinkage or expansion of the block fixation resin 52 primarily causes the position of the lens fixture block 50 to vary only in the X-direction. Furthermore, reduction in thickness of the block fixation resin 52 between the block fixation surface SOB of the lens fixture block 50 and the side surface 20A of the second substrate 20 can reduce the amount of variation of the lens fixation resin 42 per se due to shrinkage or expansion of the lens fixation resin 42. Therefore, the lens fixture block 50 hardly changes its position in the Y-direction or the Z-direction. Accordingly, the collimator lens 40, which is fixed to the lens fixture block 50, hardly changes its position in the Y-direction or the Z-direction. Thus, the collimator lens 40 can be held in a highly precisely aligned state.

Figure 4:
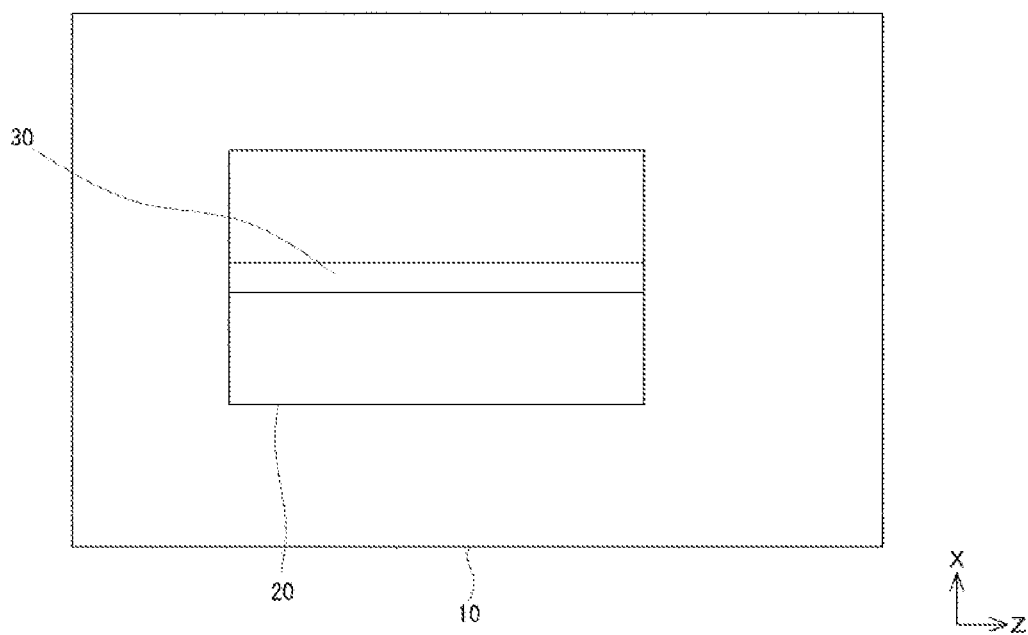
FIG. 4 is a diagram explanatory of a method of manufacturing the semiconductor laser module shown in FIG. 1.

Now a method of manufacturing a semiconductor laser module 1 according to the present invention will be described. When a semiconductor laser module 1 is to be manufactured, a semiconductor laser device 30 is first mounted onto a second substrate 20 as a device-mounting portion. Then the second substrate 20 having the semiconductor laser device 30 mounted thereon is fixed onto a first substrate 10 (FIG. 4).

Figure 5:
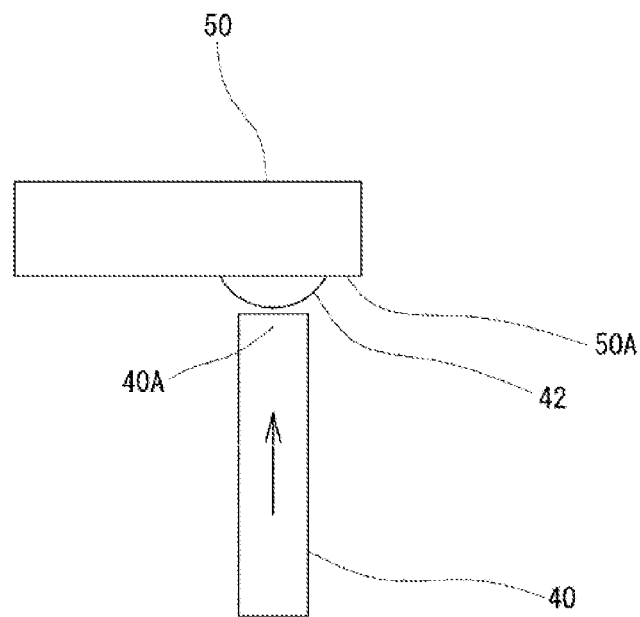
FIG. 5 is a diagram explanatory of a method of manufacturing the semiconductor laser module shown in FIG. 1.

Furthermore, a lens fixation resin 42 is applied to the lens attachment surface 50A of the lens fixture block 50. An end 40A of a collimator lens 40 is inserted into the lens fixation resin 42 in a direction perpendicular to the lens attachment surface 50A (FIG. 5). Then the lens fixation resin 42 is hardened to fix the collimator lens 40 to the lens fixture block 50. At that time, it is preferable to minimize the thickness of the lens fixation resin 42 between the collimator lens 40 and the lens attachment surface 50A.

Figure 6:
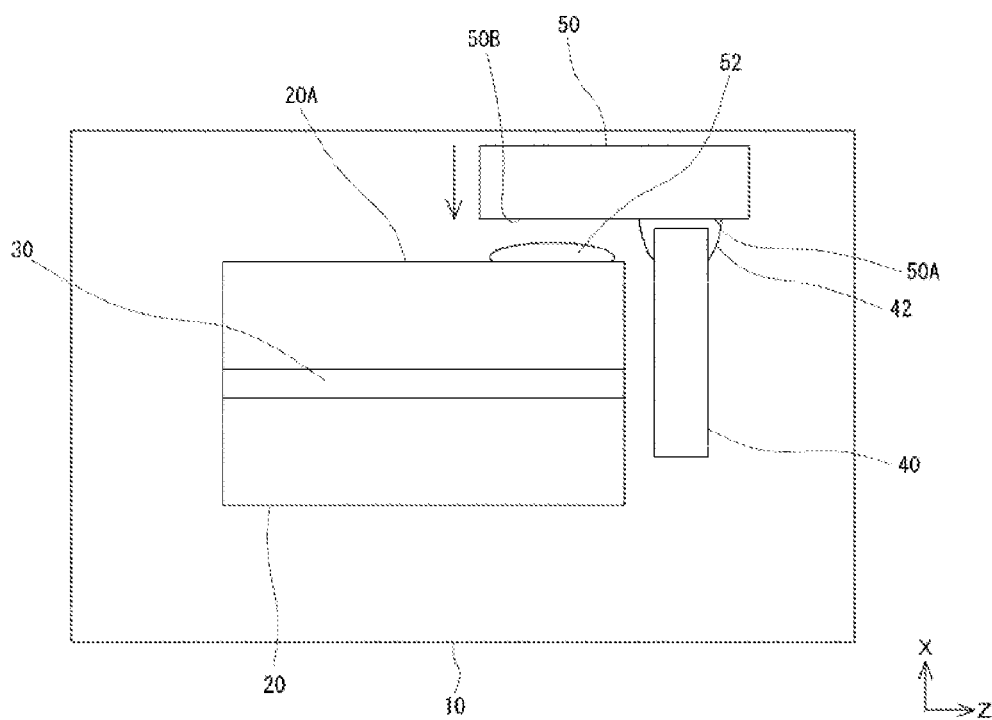
FIG. 6 is a diagram explanatory of a method of manufacturing the semiconductor laser module shown in FIG. 1.

Next, a block fixation resin 52 is applied to a side surface 20A of the second substrate 20. Then the lens fixture block 50 to which the collimator lens 40 has been fixed is brought into contact with a portion of the second substrate 20 to which the block fixation resin 52 has been applied (FIG. 6). At that time, the lens fixture block 50 has a lens attachment surface 50A that is perpendicular to the X-direction.

Subsequently, a laser beam is emitted from the semiconductor laser device 30. In that state, the lens fixture block 50 is moved so that the collimator lens 40 is positioned in place (active alignment). At that time, it is preferable to minimize the thickness of the block fixation resin 52 between the block fixation surface 50B of the lens fixture block 50 and the side surface 20A of the second substrate 20. While the collimator lens 40 has been positioned in place with high precision, the block fixation resin 52 is hardened to fix the lens fixture block 50 to the second substrate 20. In this manner, a semiconductor laser module 1 is completed (FIG. 1).

As described above, according to a method of manufacturing a semiconductor laser module 1 in the present embodiment, the collimator lens 40 is fixed to the lens fixture block 50 with the lens fixation resin 42. Therefore, this method does not require to hold an atmosphere at a high temperature, unlike solder jointing disclosed in Patent Literature 2. Accordingly, the collimator lens 40 can be positioned in place while a laser beam is emitted from the semiconductor laser device 30 (active alignment).

Furthermore, the end 40A of the collimator lens 40 along the X-direction is fixed to the lens attachment surface 50A of the lens fixture block 50, which is perpendicular to the X-direction. Therefore, shrinkage of the lens fixation resin 42 on curing or shrinkage or expansion of the lens fixation resin 42 due to a temperature change or a humidity change hardly causes the collimator lens 40 to change its position in the Y-direction or the Z-direction. Additionally, reduction in thickness of the lens fixation resin 42 between the collimator lens 40 and the lens attachment surface 50A can reduce the amount of variation of the lens fixation resin 42 per se due to shrinkage or expansion of the lens fixation resin 42. Accordingly, the collimator lens 40 can be held in a highly precisely aligned state.

Furthermore, the block fixation surface 50B of the lens fixture block 50, which is perpendicular to the X-direction, is fixed to the side surface 20A of the second substrate 20 along the X-direction. Therefore, shrinkage of the block fixation resin 52 on curing or shrinkage or expansion of the block fixation resin 52 due to a temperature change or a humidity change hardly causes the lens fixture block 50 to change its position in the Y-direction or the Z-direction. Additionally, reduction in thickness of the block fixation resin 52 between the block fixation surface 50B of the lens fixture block 50 and the side surface 20A of the second substrate 20 can reduce the amount of variation of the block fixation resin 52 per se due to shrinkage or expansion of the block fixation resin 52. Accordingly, the collimator lens 40, which is fixed to the lens fixture block 50, hardly changes its position in the Y-direction or the Z-direction. As a result, the collimator lens 40 can be held in a highly precisely aligned state.

Figure 7:
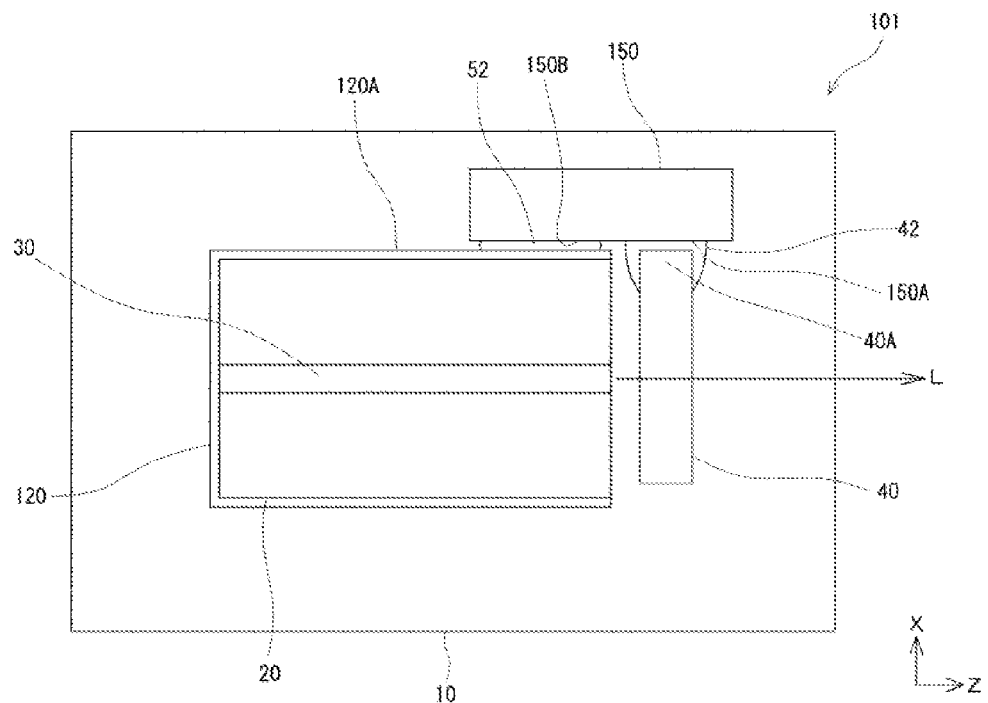
FIG. 7 is a plan view showing a semiconductor laser module according to a second embodiment of the present invention.
Figure 8:
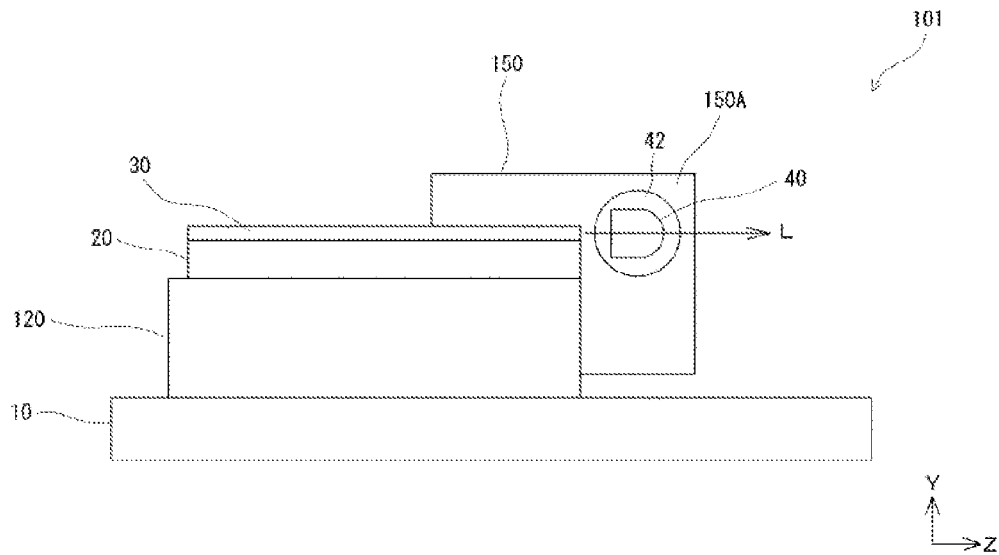
FIG. 8 is a front view of the semiconductor laser module shown in FIG. 7.
Figure 9:
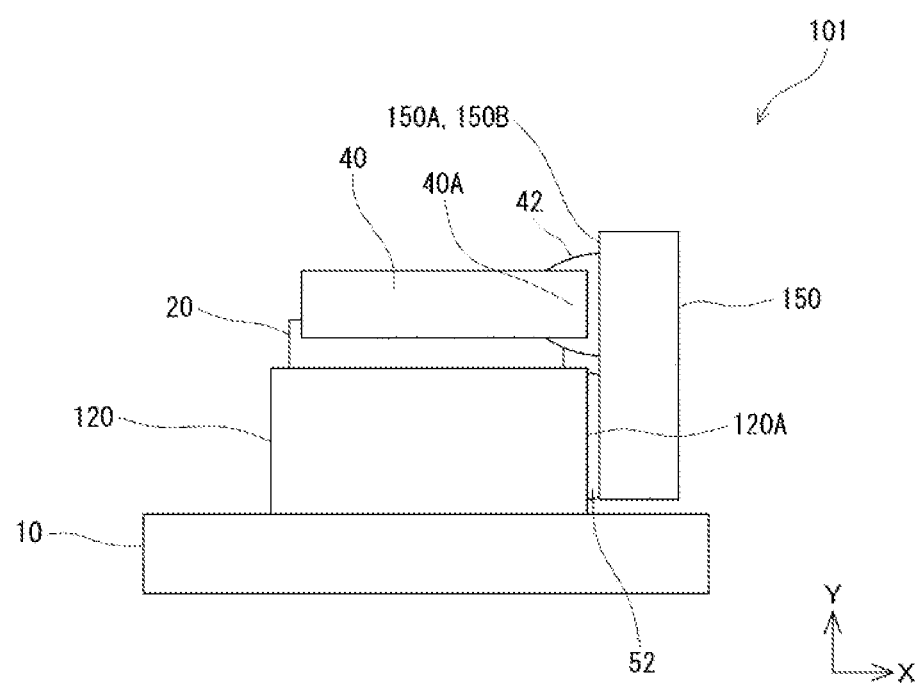
FIG. 9 is a side view of the semiconductor laser module shown in FIG. 7.

FIG. 7 is a plan view showing a semiconductor laser module 101 according to a second embodiment of the present invention, FIG. 8 is a front view of the semiconductor laser module 101, and FIG. 9 is a side view of the semiconductor laser module 101. As shown in FIGS. 7 to 9, the semiconductor laser module 101 of the present embodiment has a device-mounting portion on which a semiconductor laser device 30 is mounted. The device-mounting portion includes a second substrate 20, which is a mounting substrate on which the semiconductor laser device 30 is mounted, and a third substrate 120 as a spacer. Such a spacer 120 allows the semiconductor laser device 30 to be located at a desired height.

Furthermore, the semiconductor laser module 101 of the present embodiment has a lens fixture block 150 that is substantially in the form of a rectangular parallelepiped made of for example, glass or the like. This lens fixture block 150 has a lens attachment surface 150A and a block fixation surface 150B, which are perpendicular to the X-direction and coplanar with each other. The collimator lens 40 has an end 40A along the X-direction that is fixed to the lens attachment surface 150A with a lens fixation resin 42.

As shown in FIGS. 7 and 9, the third substrate 120 has a side surface 120A along the X-direction that is fixed to the block fixation surface 150B of the lens fixture block 150 with a block fixation resin 52. The lens fixture block 150 is held out of contact with the first substrate 10. In other words, the lens fixture block 150 is cantilevered by the third substrate 120.

Generally, a substrate on which the semiconductor laser device 30 is mounted often has a thickness of less than 0.5 mm along the fast axis direction (Y-direction). Therefore, in the aforementioned first embodiment, the width of the block fixation surface 50B of the lens fixture block 50 along the Y-direction is very small. In the present embodiment, since the spacer 120 having an appropriate thickness is provided between the first substrate 10 and the second substrate 20 so that the lens fixture block 150 is fixed to the spacer 120, a sufficient area can be ensured in the block fixation surface 150B. Thus, the spacer 120 preferably has a thickness of 0.3 mm or more along the Y-direction.

Figure 10:
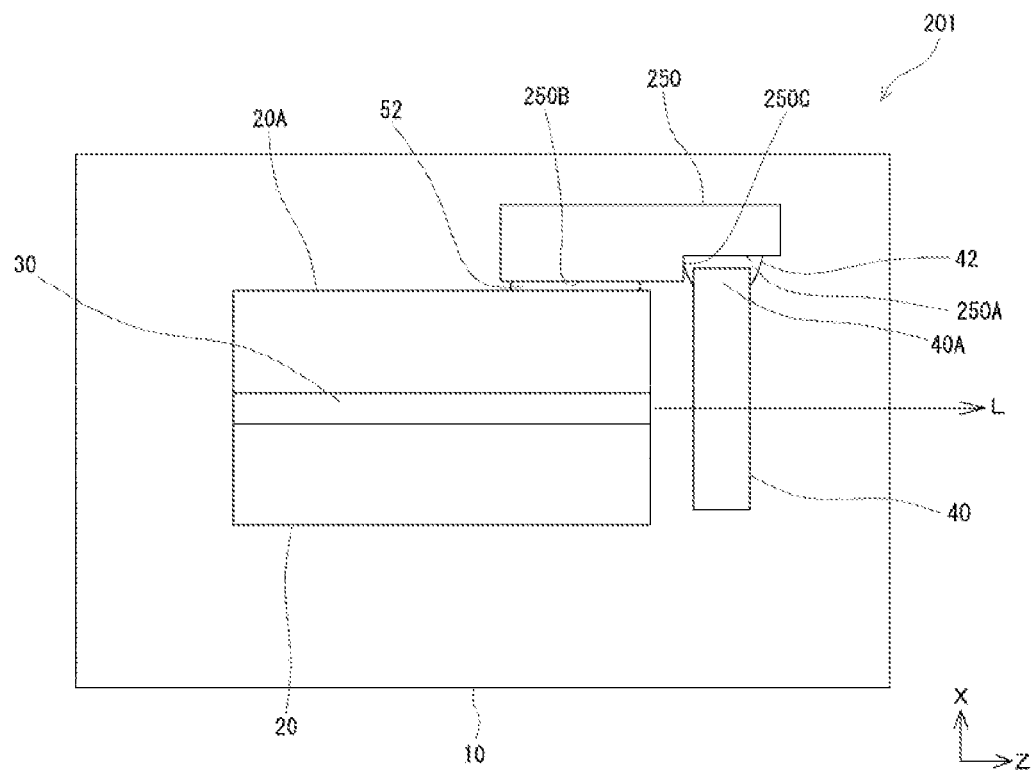
FIG. 10 is a plan view showing a semiconductor laser module according to a third embodiment of the present invention.
Figure 11:
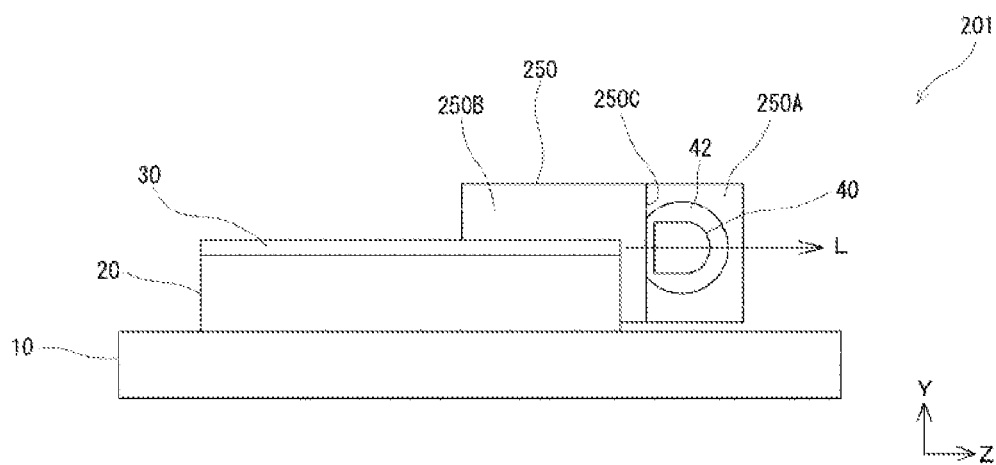
FIG. 11 is a front view of the semiconductor laser module shown in FIG. 10.

FIG. 10 is a plan view showing a semiconductor laser module 201 according to a third embodiment of the present invention, and FIG. 11 is a front view of the semiconductor laser module 201. As shown in FIGS. 10 and 11, the semiconductor laser module 201 of the present embodiment has a lens fixture block 250 that is substantially in the form of a rectangular parallelepiped made of, for example, glass or the like. As with the first embodiment, the lens fixture block 250 has a lens attachment surface 250A and a block fixation surface 250B, which are perpendicular to the X-direction. As shown in FIG. 10, however, the position of the lens attachment surface 250A of the lens fixture block 250 is deviated from the position of the block fixation surface 250B along the X-direction. Therefore, the lens attachment surface 250A and the block fixation surface 250B form a step 250C.

The collimator lens 40 has an end 40A along the X-direction that is fixed to the lens attachment surface 250A of the lens fixture block 250 with a lens fixation resin 42. The second substrate 20 has a side surface 20A along the X-direction that is fixed to the block fixation surface 250B of the lens fixture block 250 with a block fixation resin 52.

The lens fixture block 250 is held out of contact with the first substrate 10. In other words, the lens fixture block 250 is cantilevered by the second substrate 20.

Since a laser beam L emitted from the semiconductor laser device 30 spreads in the direction of the fast axis as described above, it is preferable to arrange the collimator lens 40 closer to an emitting surface of the semiconductor laser device 30. However, if the collimator lens 40 is arranged excessively close to the emitting surface of the semiconductor laser device 30 in the aforementioned first embodiment, the lens fixation resin 42 for fixing the collimator lens 40 may be brought into contact with the second substrate 20. If the lens fixation resin 42 is brought into contact with the second substrate 20, the collimator lens 40 is also fixed to an edge of the second substrate 20 along the Z-direction via the lens fixation resin 42. Therefore, shrinkage or expansion of the lens fixation resin 42 causes changes in position of the collimator lens 40 along the Z-direction. In the present embodiment, the lens attachment surface 250A of the lens fixture block 250 is arranged farther away from the second substrate 20 than the block fixation surface 250B along the X-direction so as to form the step 250C. Thus, the lens fixation resin 42 is prevented from being brought into contact with the second substrate 20 when the lens fixture block 250 is brought closer to the semiconductor laser device 30.

Figure 12:
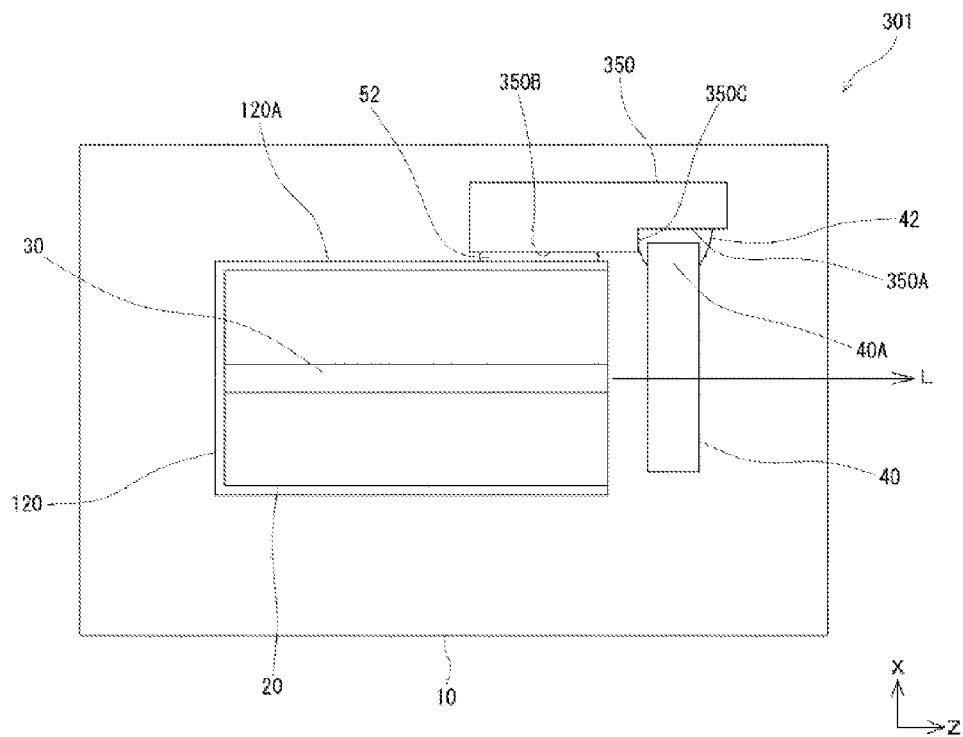
FIG. 12 is a plan view showing a semiconductor laser module according to a fourth embodiment of the present invention.
Figure 13:
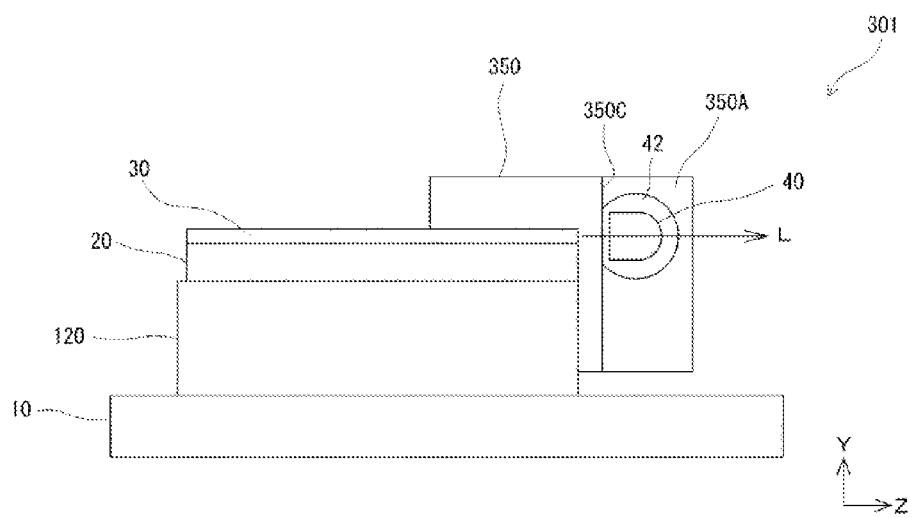
FIG. 13 is a front view of the semiconductor laser module shown in FIG. 12.

FIG. 12 is a plan view showing a semiconductor laser module 301 according to a fourth embodiment of the present invention, and FIG. 13 is a front view of the semiconductor laser module 301. The fourth embodiment is a combination of the aforementioned second embodiment and third embodiment. Specifically, as shown in FIGS. 12 and 13, the semiconductor laser module 301 of the present embodiment has a device-mounting portion on which a semiconductor laser device 30 is mounted. The device-mounting portion includes a second substrate 20, which is a mounting substrate on which the semiconductor laser device 30 is mounted, and a third substrate 120 as a spacer. Such a spacer 120 allows the semiconductor laser device 30 to be located at a desired height.

Furthermore, the semiconductor laser module 101 of the present embodiment has a lens fixture block 350 that is substantially in the form of a rectangular parallelepiped made of, for example, glass or the like. As with the second embodiment, this lens fixture block 350 has a lens attachment surface 350A and a block fixation surface 350B, which are perpendicular to the X-direction. As shown in FIG. 12, however, the lens attachment surface 350A of the lens fixture block 350 is arranged farther away from the third substrate 120 than the block fixation surface 350B along the X-direction so as to form a step 350C. With this configuration, the lens fixation resin 42 is prevented from being brought into contact with the third substrate 120 when the lens fixture block 350 is brought closer to the semiconductor laser device 30.

The collimator lens 40 has an end 40A along the X-direction that is fixed to the lens attachment surface 350A of the lens fixture block 350 with a lens fixation resin 42. The third substrate 120 has a side surface 20A along the X-direction that is fixed to the block fixation surface 350B of the lens fixture block 350 with a block fixation resin 52. The lens fixture block 350 is held out of contact with the first substrate 10. In other words, the lens fixture block 350 is cantilevered by the third substrate 120.

Figure 14:
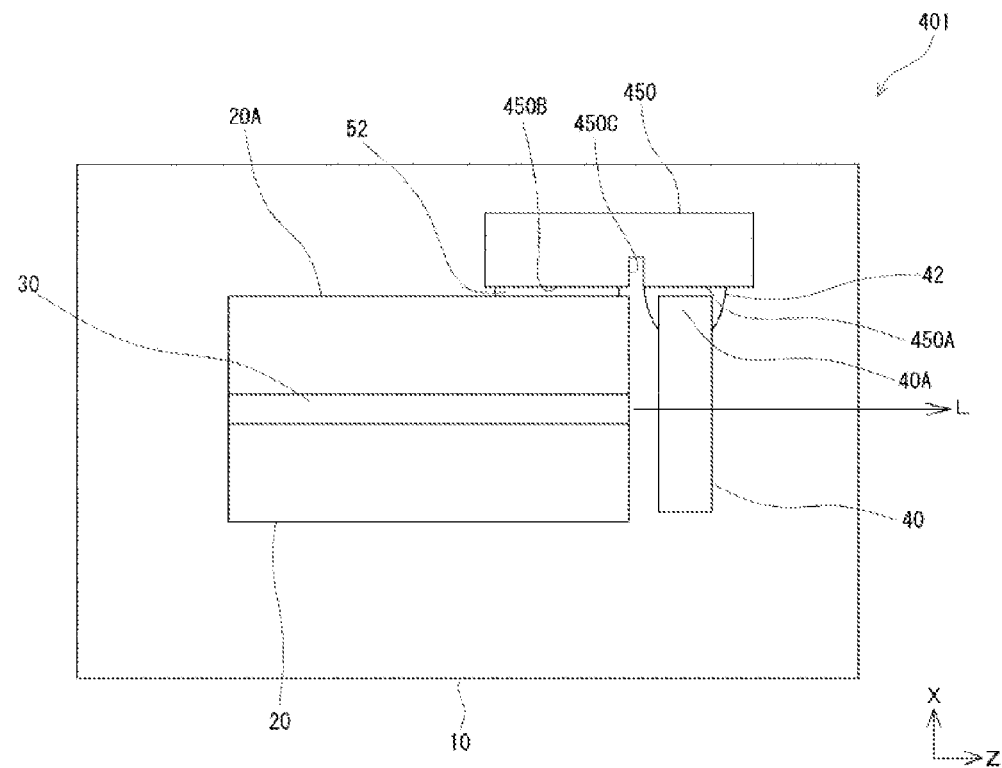
FIG. 14 is a plan view showing a semiconductor laser module according to a fifth embodiment of the present invention.
Figure 15:
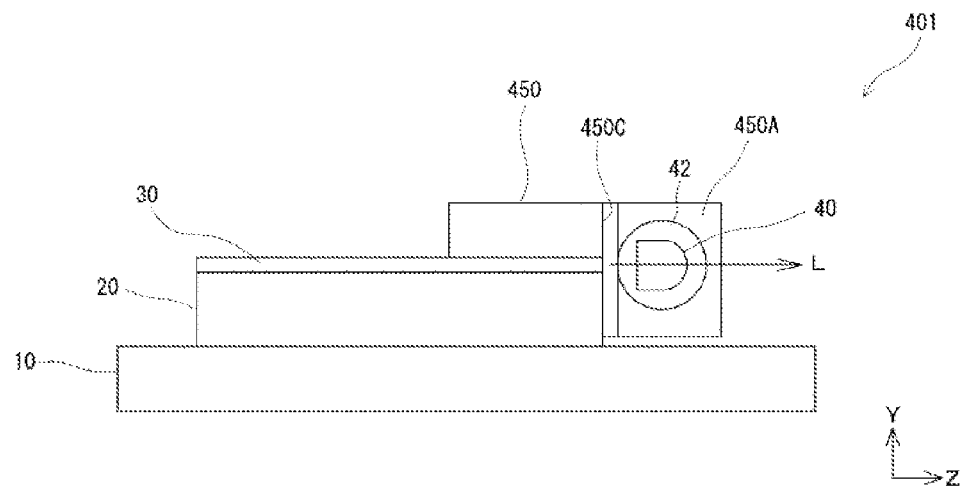
FIG. 15 is a front view of the semiconductor laser module shown in FIG. 14.

FIG. 14 is a plan view showing a semiconductor laser module 401 according to a fifth embodiment of the present invention, and FIG. 15 is a front view of the semiconductor laser module 401. As shown in FIGS. 14 and 15, the semiconductor laser module 401 of the present embodiment has a lens fixture block 450 that is substantially in the form of a rectangular parallelepiped made of, for example, glass or the like. As with the first embodiment, this lens fixture block 450 has a lens attachment surface 450A and a block fixation surface 450B, which are perpendicular to the X-direction and coplanar with each other. As shown in FIG. 14, however, a groove 450C extending along the Y-direction is formed between the lens attachment surface 450A and the block fixation surface 450B of the lens fixture block 450.

The collimator lens 40 has an end 40A along the X-direction that is fixed to the lens attachment surface 450A of the lens fixture block 450 with a lens fixation resin 42. The second substrate 20 has a side surface 20A along the X-direction that is fixed to the block fixation surface 450B of the lens fixture block 450 with a block fixation resin 52. The lens fixture block 450 is held out of contact with the first substrate 10. In other words, the lens fixture block 450 is cantilevered by the second substrate 20.

In the present embodiment, if a lens fixation resin 42 applied to the lens attachment surface 450A of the lens fixture block 450 exceeds a certain amount, an excess lens fixation resin 42 flows into the groove 450C between the lens attachment surface 450A and the block fixation surface 450B. Therefore, the lens fixation resin 42 is prevented from being brought into contact with the second substrate 20 when the lens fixture block 450 is brought closer to the semiconductor laser device 30.

Figure 16:
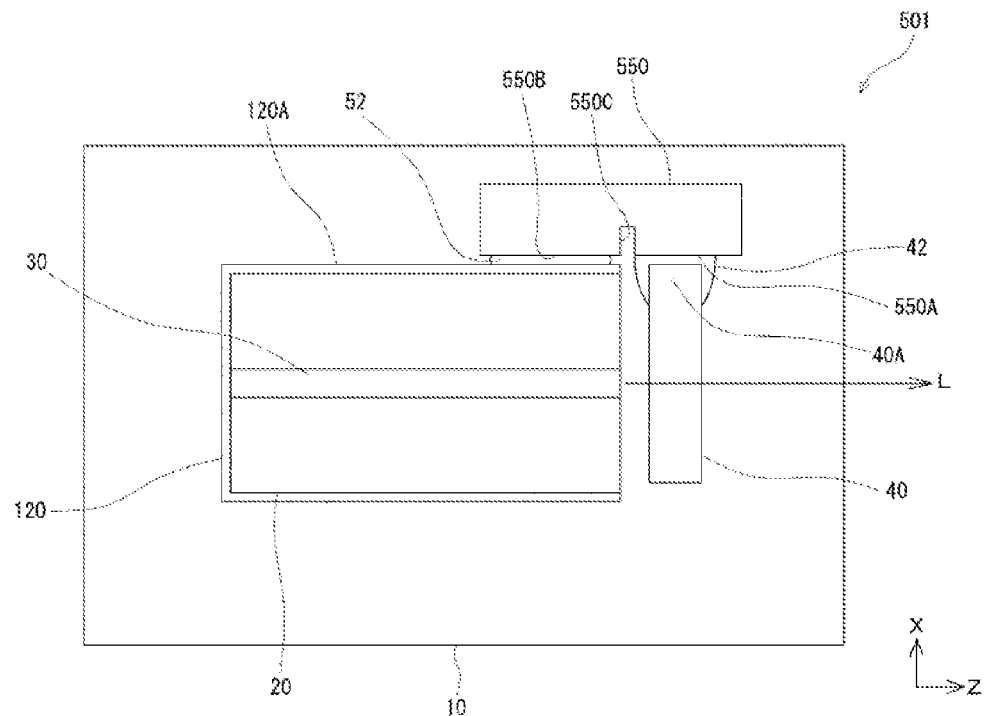
FIG. 16 is a plan view showing a semiconductor laser module according to a sixth embodiment of the present invention.
Figure 17:
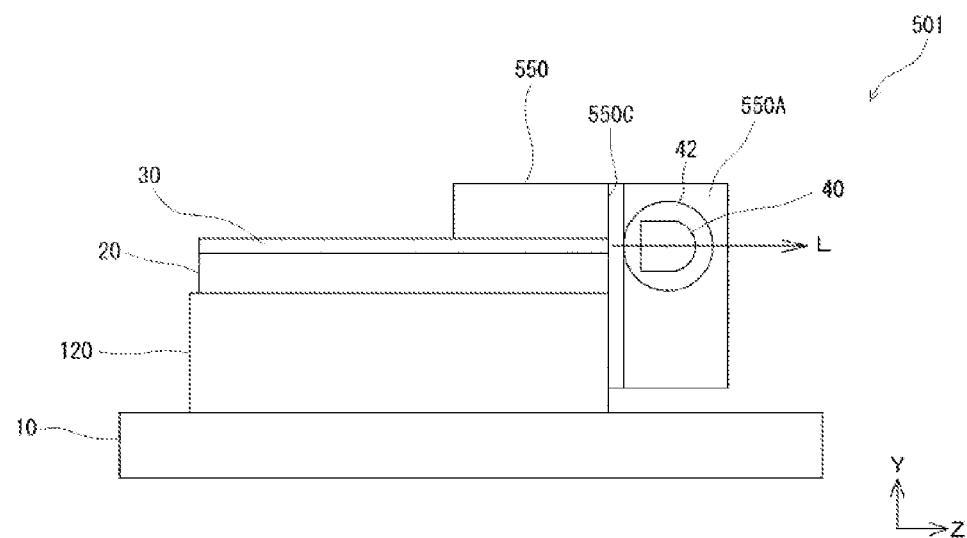
FIG. 17 is a front view of the semiconductor laser module shown in FIG. 16.

FIG. 16 is a plan view showing a semiconductor laser module 501 according to a sixth embodiment of the present invention, and FIG. 17 is a front view of the semiconductor laser module 501. The sixth embodiment is a combination of the aforementioned second embodiment and fifth embodiment. Specifically, as shown in FIGS. 16 and 17, the semiconductor laser module 501 of the present embodiment has a device-mounting portion on which a semiconductor laser device 30 is mounted. The device-mounting portion includes a second substrate 20, which is a mounting substrate on which the semiconductor laser device 30 is mounted, and a third substrate 120 as a spacer. Such a spacer 120 allows the semiconductor laser device 30 to be located at a desired height.

Furthermore, the semiconductor laser module 501 of the present embodiment has a lens fixture block 550 that is substantially in the form of a rectangular parallelepiped made of, for example, glass or the like. As with the first embodiment, this lens fixture block 550 has a lens attachment surface 550A and a block fixation surface 550B, which are perpendicular to the X-direction and coplanar with each other. As shown in FIG. 16, however, a groove 550C extending along the Y-direction is formed between the lens attachment surface 550A and the block fixation surface 550B of the lens fixture block 550. With this configuration, the lens fixation resin 42 is prevented from being brought into contact with the third substrate 120 when the lens fixture block 550 is brought closer to the semiconductor laser device 30.

The collimator lens 40 has an end 40A along the X-direction that is fixed to the lens attachment surface 550A of the lens fixture block 550 with a lens fixation resin 42. The third substrate 120 has a side surface 120A along the X-direction that is fixed to the block fixation surface 550B of the lens fixture block 550 with a block fixation resin 52. The lens fixture block 550 is held out of contact with the first substrate 10. In other words, the lens fixture block 550 is cantilevered by the third substrate 120.

The above embodiments describe a configuration of fixing only one of ends of the collimator lens 40 along the X-direction. However, a similar lens fixture block may be provided for another end of the collimator lens 40 so as to fix both of the ends of the collimator lens 40 along the X-direction.

Moreover, the collimator lens 40 in the above embodiments collimates components of the laser beam L along the direction of the fast axis (Y-direction). The present invention is also applicable to use of a lens for collimating components of the laser beam L along the direction of the slow axis (X-direction). In such a case, the lens attachment surface and the block fixation surface of the lens fixture block is arranged in parallel to the XZ-plane, and an end of the collimator lens along the Y-direction is fixed to the lens attachment surface.

Although some preferred embodiments of the present invention have been described, the present invention is not limited to the aforementioned embodiments. It should be understood that various different forms may be applied to the present invention within the technical idea thereof.

INDUSTRIAL APPLICABILITY

The present invention is suitable for use in a semiconductor laser module including a semiconductor laser device and a collimator lens for collimating a laser beam emitted from the semiconductor laser device.

DESCRIPTION OF REFERENCE NUMERALS AND SIGNS

L laser beam
1 semiconductor laser module
10 first substrate
20 second substrate (mounting substrate)
20A side surface
30 semiconductor laser device
40 collimator lens
40A end
42 lens fixation resin
50 lens fixture block
50A lens attachment surface
50B block fixation surface
52 block fixation resin
101 semiconductor laser module
120 third substrate (spacer)
120A side surface
150A lens attachment surface
150B block fixation surface
201 semiconductor laser module
250A lens attachment surface
250B block fixation surface
250C step
301 semiconductor laser module
350A lens attachment surface
350B block fixation surface
350C step
401 semiconductor laser module
450A lens attachment surface
450B block fixation surface
450C groove
501 semiconductor laser module
550A lens attachment surface
550B block fixation surface
550C groove

The invention claimed is:

1. A semiconductor laser module comprising:
a substrate;
a device-mounting portion provided on the substrate;
a semiconductor laser device mounted on the device-mounting portion, the semiconductor laser device emitting a laser beam having an optical axis along a first direction;
a collimator lens configured to collimate a component of the laser beam emitted from the semiconductor laser device along a second direction perpendicular to the first direction; and
a lens fixture block having a lens attachment surface perpendicular to a third direction that is perpendicular to the first direction and the second direction and a block fixation surface perpendicular to the third direction,
wherein at least one of ends of the collimator lens along the third direction is fixed to the lens attachment surface of the lens fixture block with a lens fixation resin, and
the block fixation surface of the lens fixture block is opposed to and attached to a side surface of the device-mounting portion which is perpendicular to the third direction with a block fixation resin.

2. The semiconductor laser module as recited in claim 1, characterized in that the second direction is a direction along a fast axis of the laser beam emitted from the semiconductor laser device.

3. The semiconductor laser module as recited in claim 1, characterized in that a position of the lens attachment surface of the lens fixture block is located farther away from the device-mounting portion than a position of the block fixation surface of the lens fixture block along the third direction.

4. The semiconductor laser module as recited in claim 1, characterized in that a groove is formed between the lens attachment surface and the block fixation surface of the lens fixture block for preventing the lens fixation resin from being brought into contact with the device-mounting portion.

5. The semiconductor laser module as recited in claim 1, characterized in that the device-mounting portion includes a mounting substrate on which the semiconductor laser device is mounted and a spacer having a certain thickness,
wherein the block fixation surface of the lens fixture block is fixed to a side surface of the spacer of the device-mounting portion along the third direction with the block fixation resin.

6. The semiconductor laser module as recited in claim 1, characterized in that the lens fixation resin is a UV-curable resin or a thermosetting resin.

7. The semiconductor laser module as recited in claim 1, characterized in that the block fixation resin is a UV-curable resin or a thermosetting resin.

8. The semiconductor laser module as recited in claim 1, characterized in that an equal amount of the lens fixation resin is present on opposite sides of the collimator lens along the first direction, and
an equal amount of lens fixation resin is present on opposite sides of the collimator lens along the second direction.

9. A method of manufacturing a semiconductor laser module having a semiconductor laser device operable to emit a laser beam having an optical axis along a first direction and a collimator lens configured to collimate a component of the laser beam emitted from the semiconductor laser device along a second direction perpendicular to the first direction, comprising:
- mounting the semiconductor laser device to a device-mounting portion;
- fixing the device-mounting portion to a substrate;
- applying a lens fixation resin to a lens attachment surface formed on a lens fixture block;
- inserting an end of the collimator lens along a third direction into the lens fixation resin applied to the lens attachment surface in a state in which the lens attachment surface is perpendicular to the third direction that is perpendicular to the first direction and the second direction;
- hardening the lens fixation resin to fix the collimator lens to the lens fixture block;
- applying a block fixation resin to a side surface of the device-mounting portion which is perpendicular to the third direction;
- bringing the lens fixture block into contact with the block fixation resin such that a block fixation surface of the lens fixture block which is perpendicular to the third direction is opposed to and attached to the side surface;
- positioning the collimator lens into a desired location while emitting a laser beam from the semiconductor laser device; and
- when the collimator lens has been positioned, hardening the block fixation resin to fix the lens fixture block and the collimator lens relative to the device-mounting portion.

10. The method of manufacturing a semiconductor laser module as recited in claim 9, characterized in that the second direction is a direction along a fast axis of the laser beam emitted from the semiconductor laser device.

11. The method of manufacturing a semiconductor laser module as recited in claim 9, characterized in that the inserting the end of the collimator lens into the lens fixation resin comprises equalizing amounts of the lens fixation resin present on opposite sides of the collimator lens along the first direction and equalizing amounts of the lens fixation resin present on opposite sides of the collimator lens along the second direction.

12. The method of manufacturing a semiconductor laser module as recited in claim 9, characterized in that the device-mounting portion includes a mounting substrate and a spacer having a certain thickness,
- wherein the mounting the semiconductor laser device to the device-mounting portion comprises:
- mounting the semiconductor laser device to the mounting substrate, and
- fixing the mounting substrate to the spacer,
- wherein the applying the block fixation resin to the side surface of the device-mounting portion along the third direction comprises applying the block fixation resin to a side surface of the spacer along the third direction.

* * * * *